United States Patent
Cook

[19]

[11] Patent Number: 6,140,870
[45] Date of Patent: Oct. 31, 2000

[54] HYBRID THERMIONIC VALVE AND SOLID STATE AUDIO AMPLIFIER

[76] Inventor: Erick M. Cook, 519 Kingwood Dr. NW., Salem, Oreg. 97304

[21] Appl. No.: 09/080,875

[22] Filed: May 18, 1998

[51] Int. Cl.[7] ........................................... H03F 5/00
[52] U.S. Cl. ............................ 330/3; 330/118; 330/150
[58] Field of Search ........................ 330/3, 150, 118–123

[56] References Cited

U.S. PATENT DOCUMENTS

| | | | |
|---|---|---|---|
| 3,315,172 | 4/1967 | Durgin | 330/3 |
| 3,328,711 | 6/1967 | Wolcott | 330/3 |
| 3,421,102 | 1/1969 | Andrews | 330/3 |
| 4,324,950 | 4/1982 | Strickland | 179/1 A |
| 4,532,476 | 7/1985 | Smith | 330/123 |
| 4,593,251 | 6/1986 | Smith | 330/123 |
| 4,636,740 | 1/1987 | Kager | 330/123 |
| 4,701,957 | 10/1987 | Smith | 381/61 |
| 4,713,624 | 12/1987 | Smith | 330/118 |
| 4,890,331 | 12/1989 | Brown, Sr. et al. | 381/61 |
| 4,918,394 | 4/1990 | Modafferi | 330/3 |
| 4,937,874 | 6/1990 | Pittman | 381/61 |
| 5,012,199 | 4/1991 | McKale | 381/61 |
| 5,017,884 | 5/1991 | Perandi | 330/3 |
| 5,022,305 | 6/1991 | Butler | 381/61 |
| 5,023,915 | 6/1991 | Brown, Sr. et al. | 381/61 |
| 5,127,059 | 6/1992 | Elion et al. | 381/61 |
| 5,148,116 | 9/1992 | Robinson | 330/3 |
| 5,343,159 | 8/1994 | Butler | 330/3 |
| 5,450,034 | 9/1995 | Werrbach | 330/3 |
| 5,467,400 | 11/1995 | Keir | 381/61 |
| 5,524,055 | 6/1996 | Sondermeyer | 381/61 |
| 5,546,046 | 8/1996 | Trentino | 330/123 |
| 5,559,469 | 9/1996 | Smith | 330/123 |
| 5,612,646 | 3/1997 | Berning | 330/10 |
| 5,636,284 | 6/1997 | Pritchard | 381/161 |
| 5,668,499 | 9/1997 | Albert et al. | 330/118 |
| 5,705,950 | 1/1998 | Butler | 330/3 |
| 5,721,784 | 2/1998 | Bernardo | 381/89 |
| 5,909,145 | 1/1999 | Zimmerman | 330/123 |

OTHER PUBLICATIONS

Hughes & Kettner Product Literature.

*Primary Examiner*—Robert Pascal
*Assistant Examiner*—Khanh Van Nguyen
*Attorney, Agent, or Firm*—Birdwell & Janke, LLP

[57] ABSTRACT

A hybrid thermionic valve and solid state audio amplifier. A complete tube amplifier is scaled to produce a relatively low power yet also retain its small and large signal distortion characteristics. The output of the scaled amplifier is amplified by a relatively linear solid state amplifier. In one embodiment of the invention, a plurality of tube amplifiers are coupled in parallel and input to a mixing circuit for selectably mixing the outputs of the tube amplifiers and providing the mixed outputs to the solid state amplifier.

19 Claims, 11 Drawing Sheets

HYBRID THERMIONIC VALVE AND SOLID STATE AUDIO AMPLIFIER

BACKGROUND OF THE INVENTION

This invention relates to audio amplifiers combining thermionic valves and solid state amplification devices.

Audio amplifiers employing thermionic valves, most commonly known as vacuum tubes, (hereinafter "tube amplifiers") remain highly prized by audiophiles for their sonic characteristics. Such characteristics include a "warmth" and "coloring" of musical sound that, it is generally believed, cannot be provided by audio amplifiers employing only solid state amplification devices.

Some particular tube amplifiers are sought for additional reasons. The sonic characteristics of tube guitar amplifiers is desired by more than a generation of young people who have grown up associating such characteristics with rock and roll bands since the 1950's. Particularly, amplifiers manufactured by Fender Musical Instruments Corp. of Scottsdale, Ariz. and marketed under the trademark FENDER (hereinafter "Fender") and amplifiers manufactured by Marshall Amplification of Bletchley, Milton Keynes, UK under the trademark MARSHALL (hereinafter "Marshall"), have become through now hallowed tradition the rock and roll amplifiers of choice. Musicians and their fans have become accustomed to the sound produced by these types of amplifiers to such an extent that their characteristics are inseparable from the characteristics of the guitar. These characteristics are all the more identifying because guitar amplifiers are commonly driven into non-linear operation where large signal distortion characteristics become pronounced. Consequently, solid state guitar amplifiers in particular have not been successful in faithfully reproducing the characteristic sounds of earlier vacuum tube designs, despite their superior energy efficiency, lighter weight and greater reliability.

In practice, performers will either switch between a Fender amplifier and its associated speaker and a Marshall amplifier and its associated speaker during a performance to produce different sounds, or use a guitar amplifier which employs channel switching techniques to perform the same function, such as exemplified in Smith, U.S. Pat. No. 4,701,957, and Brown, Sr. et al., U.S. Pat. Nos. 5,023,915 and 4,890,331. In the former case, either a foot switch or stereo/pan pedal is used to change the output of the guitar from the input of one amplifier to the input of the other. In the case of channel switching, a foot switch is used to change the circuit characteristics, e.g., topology, of the amplifier. The need to provide and employ two guitar amplifiers in the former case is a problem, and in either case the amplifiers have all of the typical disadvantages of tube amplifiers. That is, tube amplifiers have relatively poor reliability, and are heavy, bulky and expensive in comparison to solid state amplifiers.

There have been efforts to combine the use of transistors with thermionic valves in amplifier design. For example, Robinson, U.S. Pat. No. 5,148,116 ("Robinson"), proposes providing a feed-back voltage from a transistor output stage to the control grid of a vacuum tube. Butler, U.S. Pat. No. 5,705,950 ("Butler"), employs a solid state amplifier stage followed by a vacuum tube stage. The basic amplifier in Butler may be incorporated as a predriver circuit into a multistage amplifier.

Such attempts have been successful to introduce some of the characteristics of tube sound in an audio power amplifier employing solid state amplification. However, the sonic characteristics of an amplifier include both the small and large signal distortion. In prior art attempts at emulating the characteristics of tube amplifiers in solid state amplifiers, the architectures employed have generally not retained the tube amplifier's large signal distortion characteristics. For example, both Robinson and Butler propose to employ vacuum tube amplifier stages essentially as preamplifiers which are not intended to operate in large signal distortion mode. And where vacuum tubes are employed in the output stage of a hybrid amplifier adapted to provide sufficient power to drive a loudspeaker, many of the disadvantages of tube amplifiers are retained.

Accordingly, there is a need for a hybrid thermionic valve and solid state audio amplifier that provides for the sonic characteristics of a vacuum tube amplifier along with the desirable characteristics of a solid state amplifier, such as greater efficiency and reliability, and lower cost and weight.

SUMMARY OF THE INVENTION

The present invention solves the aforementioned problems and meets the aforementioned needs by providing a tube amplifier section having an output coupled to the input of a solid state, relatively linear amplifier section, wherein the tube amplifier section employs the architectural features of a complete tube amplifier as it would normally operate alone and which, therefore, introduces the full degree of coloration, both small and large signal, that such amplifiers normally produce. The tube amplifier section is obtained by, using the model of a complete tube amplifier that is adapted to receive an input signal such as that provided by an electric guitar and amplify the signal to drive a loudspeaker at normal room listening levels, scaling the tube amplifier to produce a relatively low power output at which the scaled tube amplifier also retains its small and large signal distortion characteristics. The colored output of the scaled tube amplifier is amplified by the relatively economical, efficient and linear solid state amplifier to produce a sufficient power to drive the loudspeaker at the ordinary room listening levels.

In one embodiment of the invention, a single tube amplifier is employed as the front end to the solid state amplifier. In another embodiment of the invention, a plurality of tube amplifiers are coupled in parallel and input to a mixing circuit for selectably mixing the outputs of the tube amplifiers and providing the mixed outputs to the solid state amplifier.

Accordingly, it is a principal object of the present invention to provide a novel hybrid thermionic valve and solid state audio amplifier.

It is another object of the present invention to provide such an audio amplifier that provides for the sonic characteristics of a tube amplifier along with the desirable characteristics of a solid state amplifier.

The foregoing and other objects, features and advantages of the invention will be more readily understood upon consideration of the following detailed description of the invention, taken in conjunction with the following drawings.

DETAILED DESCRIPTION OF A PREFERRED EMBODIMENT

Figure 1:
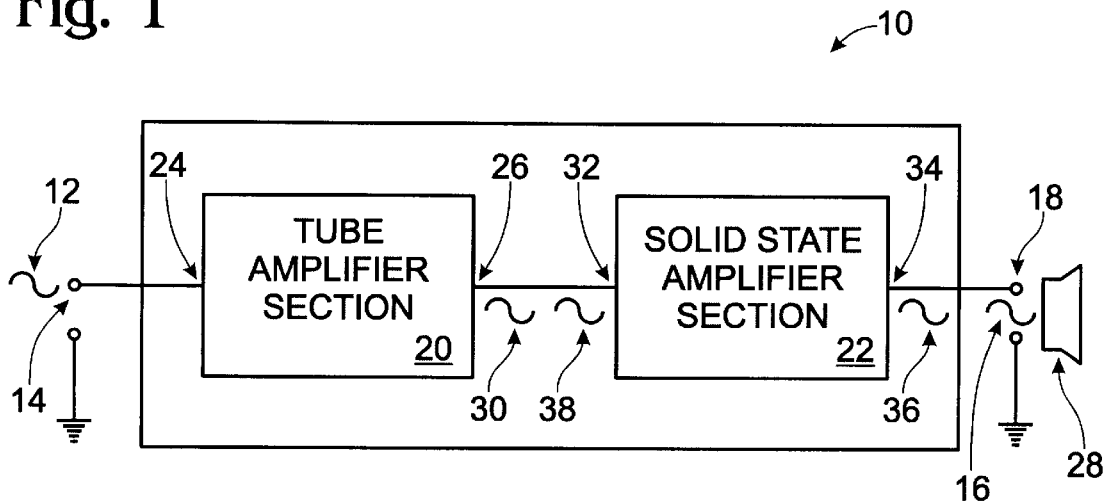
FIG. 1 is a block diagram of a first embodiment of an amplifier according to the present invention.

Referring to FIG. 1, a hybrid thermionic valve and solid state audio amplifier 10 according to the present invention is shown. An audio electrical input signal 12 which it is desired to amplify is provided at the input 14 to the amplifier 10. Input line levels for audio electronic apparatus are typically rated with respect to a 0 dBv reference of 1 milliwatt into 600 ohms and typically vary from about 2.5 millivolts or −50 dBv for microphone inputs, to about 1.25 volts or +4 dBv for the input to a power amplifier. The input signal 12 is often produced by an electric guitar or other electrical musical instrument. Though reference will frequently be made herein to use of the amplifier 10 for amplifying the electrical signal from an electric guitar, it will be understood that the audio amplifier may be employed for amplifying other electrical input signals for other purposes.

The amplifier 10 produces an output signal 16 at an output 18 of the amplifier, the output 18 typically driving a loudspeaker 28 at least a normal room listening level sufficient for the enjoyment of music inside the home.

The amplifier 10 includes a tube amplifier section 20 and a solid state amplifier section 22. The tube amplifier section has an input 24 and an output 26 at which the tube amplifier section produces a first amplified signal 30. The solid state amplifier section has an input 32 for receiving an input signal 38 and an output 34 at which the amplifier section 22 produces a second amplified signal 36.

The tube amplifier section 20 includes one or more thermionic valves which produce the first amplified signal 30 and, hence, the output signal 16. As is well known, these valves function by thermionic emission wherein attraction of the resulting stream of electrons to an anode is controllably mediated by a grid. As aforementioned, many contend that valves exhibit small signal distortion characteristics that provide a pleasing "warmth" and "color" to electrical signals used for reproducing or creating musical sounds that solid state amplifiers do not provide. Moreover, as for tube amplifiers for the electric guitar, it is often the case that the characteristic large signal distortion of a tube amplifier, where clipping and limiting are present, is also sought for its musical effect.

The tube amplifier section 20 is modeled from a tube amplifier that is "complete" in the sense that it is adapted to receive an input signal 12 such as from the pick-up on an electric guitar and amplify the signal so as to drive a loudspeaker 28 at normal room listening levels. The scaled tube amplifier 20, while retaining the architecture of the complete tube amplifier, which may be a prior art or other tube amplifier of choice, is preferably adapted to amplify the signal to a power level that is insufficient to drive the loudspeaker at ordinary room listening levels, but at which, nevertheless, the scaled tube amplifier manifests substantially the sonic characteristics of the unscaled tube amplifier driving the loudspeaker at normal room listening levels.

For retaining the full measure of distortion characteristics and, therefore, the warmth and color of the typical tube amplifier, an output transformer is preferably coupled to the output 26. Such output transformers are routinely provided in tube amplifiers whose outputs are adapted to drive loudspeakers, to match the output impedance of the valves to the input impedance of the loudspeaker, and contribute significantly to the tube amplifier's sonic characteristics.

The characteristics of the solid state amplifier section are preferably provided to be relatively linear by comparison with the characteristics of the tube amplifier section, so that the distortions evident in the overall output signal 16 result primarily from contributions of the latter. It is typically the case that a solid state amplifier providing relatively linear performance is also relatively economical and efficient. To realize all the advantages of the present invention, the solid state amplifier section employs no thermionic valves and employs, instead, all solid state components, such as BJTs or MOSFETs for producing the second amplified signal 36 from the input signal 38, though the solid state amplifier section need not consist exclusively of solid state components for practicing the invention. As advances in solid state electronics are continually being made, it is not intended herein that the solid state amplifier section 22 be limited to any particular amplification device, fabrication technology, or material.

The scaled tube amplifier section 20 is coupled in cascade relationship to the solid state amplifier section 22. Specifically, the input 24 and output 26 of the tube amplifier section are coupled to, respectively, the input signal 12 and the input 32 of the solid state amplifier section, and the output 34 of the solid state amplifier section is coupled to the overall output 18. In this configuration, the input signal 38 and the second amplified signal 36 of the solid state amplifier are, respectively, the first amplified signal 30 and the output signal 16. The solid state amplifier section amplifies the output 30 of the tube amplifier section back to a sufficient power to drive the loudspeaker at ordinary room listening levels.

This configuration permits the tube amplifier section 20 to produce a low power output while retaining the warmth and coloring in the first amplified signal 30 that a prior art, unscaled tube amplifier of the same architecture would exhibit at high power outputs. It has been found that good results are obtained by scaling the tube amplifier section so as to enable it to produce about 1 Watt maximum rated output power. As it is relatively economical, weight and space efficient to provide for low distortion in a linear solid state amplifier section that boosts the first amplified signal to desired room listening levels, the advantages of the prior art tube amplifier in this configuration are provided substantially without its disadvantages.

This configuration provides particular advantage where it desired to operate the tube amplifier section as a Class A amplifier. Tube amplifiers configured in Class A have very poor efficiencies—on the order of 25%. All of the components must be particularly adapted to carry and dissipate large amounts of power, increasing weight, bulk and cost and decreasing tube life to an even greater degree. However, scaling a tube amplifier to produce the tube amplifier section 20 of the present invention scales both the useful power and the wasted power. Where the tube amplifier section 20 is adapted to produce a maximum 1 Watt rated power output, the wasted power is only about 4 Watts. The solid state amplifier section 22 may then amplify the first amplified signal 30 as, e.g., a Class AB amplifier, and the second amplified signal 36 will retain the sound of the tube amplifier section 20 operating in Class A at high power.

A particular example of scaling of the tube amplifier section 20 is next discussed in connection with the popular Fender and Marshall guitar amplifiers, the extension to other kinds of tube amplifiers being readily apparent to one of ordinary skill in light thereof. It is to be understood that scaling may be accomplished by any other means known in the art without departing from the principles of the invention. Moreover, while particular scaling modifications implicate associated features and advantages of the invention, it should be understood that not all or any particular features and advantages as illustrated must be present for practice of the invention.

Figure 3:
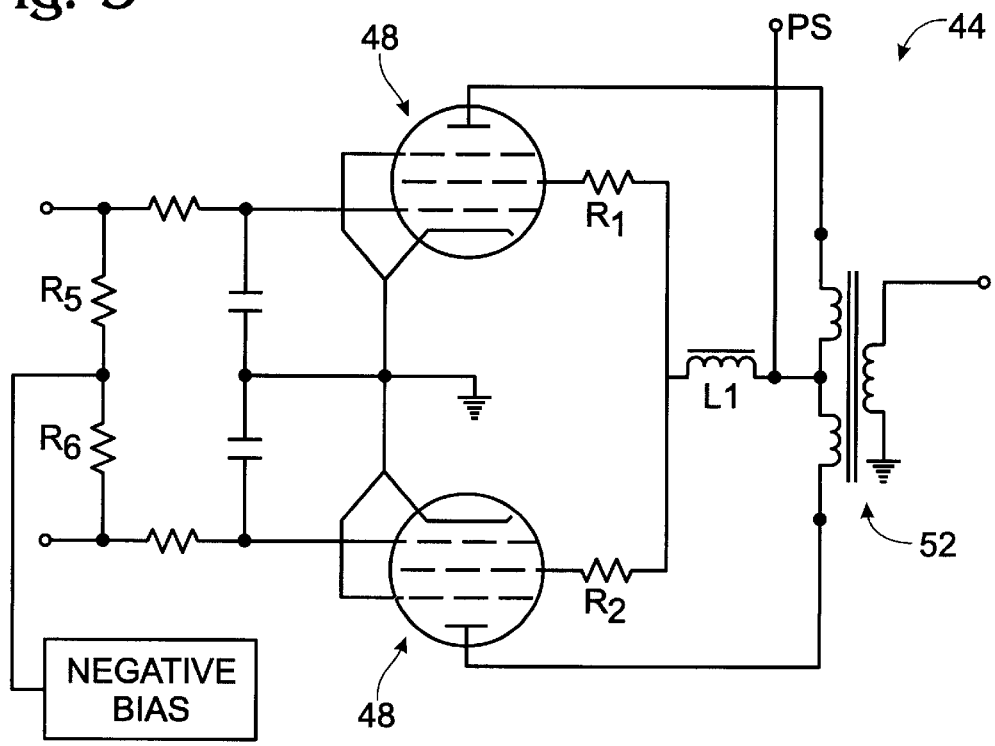
FIG. 3 is a simplified schematic of the power output section of the amplifier of FIG. 2.
Figure 2:
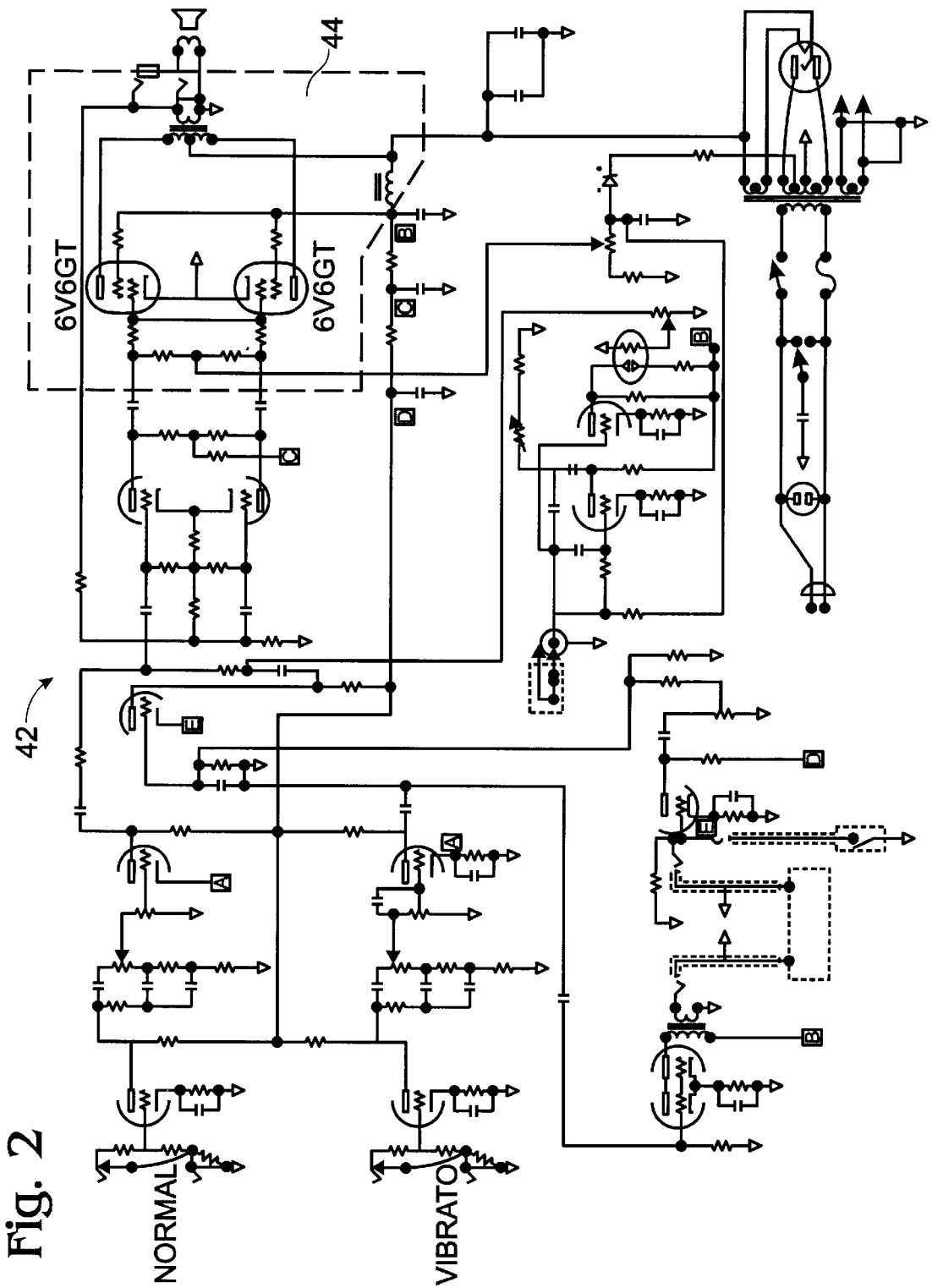
FIG. 2 is a schematic of a prior art Fender tube amplifier.
Figure 4:
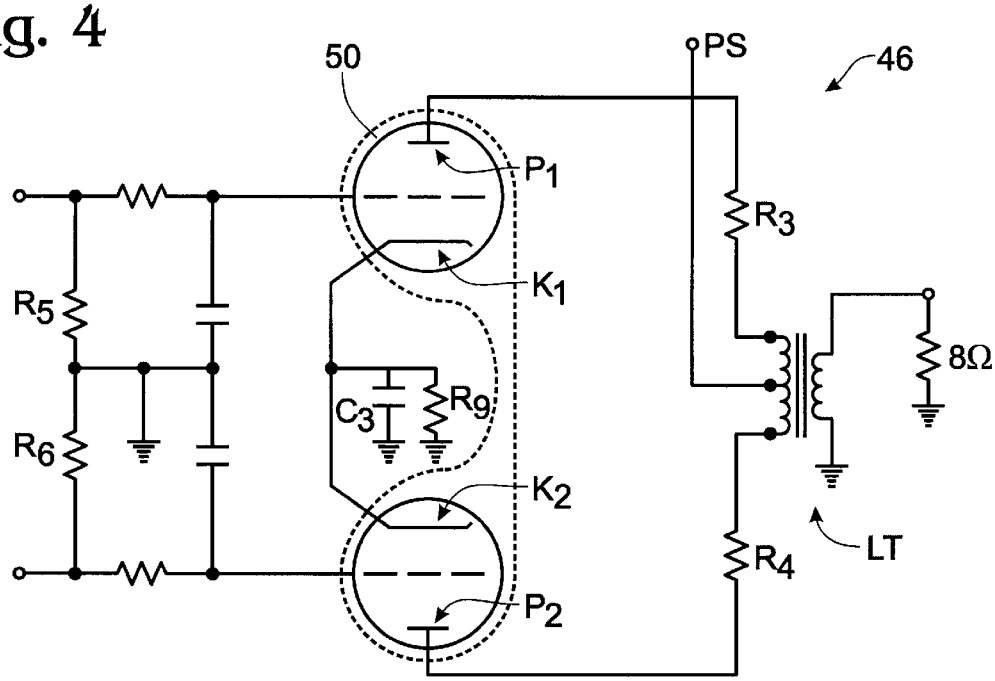
FIG. 4 is a schematic of the power output section of FIG. 3, scaled according to the present invention.

Referring to FIG. 2, a schematic of a representative Fender amplifier 42, the "Deluxe Reverb-AmpAB868," is depicted. A "push-pull" power output section 44 of the amplifier 42 is shown in FIG. 3, and a corresponding scaled power output section 46 is shown in FIG. 4. To scale the power output section 44 to produce the power output section 46, the following modifications to the output section 44 are evident in a comparison of FIGS. 3 and 4.

Figure 5:
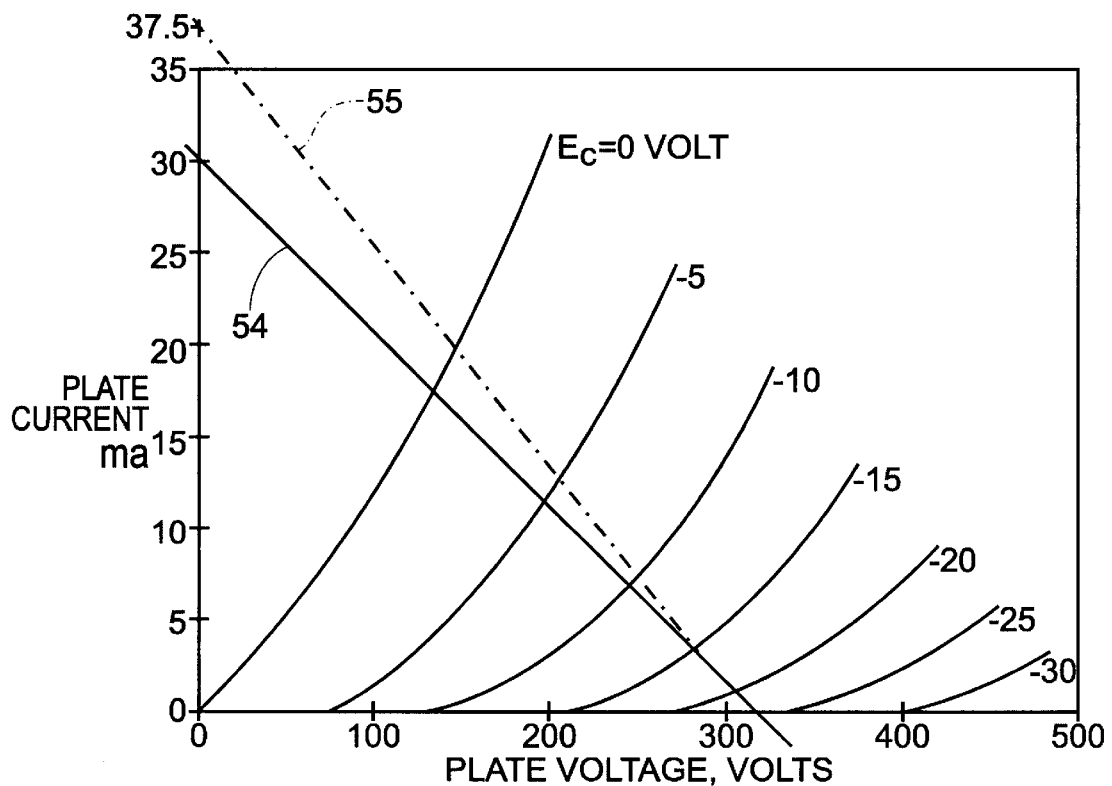
FIG. 5 is a plot of the characteristics of a 12AU7 dual triode showing an operating point thereof according to the present invention.

First, 6V6GT beam power pentodes 48 are replaced with a single 12AU7 dual triode 50. The screen grid resistors R1 and R2 and choke L1 are accordingly eliminated. A preferred operating point for the 12AU7 dual triode 50 is shown in FIG. 5, employing an AC load line 54 of 10.4K ohms and a DC load line 55 of 8.4K ohms.

The dual triode 50 has a reduced power supply voltage PS, from 400–450 volts (or more) in the amplifier 42 to about 300 volts in the power output section 46, and has a reduced power input requirement from about 50 Watts to about 5 Watts. This results in a reduction in cost and space for such components as power transformers and power supply filter capacitors. Use of the dual triode 48 eliminates the requirement for matched pairs of output tubes and reduces weight and space requirements. The drive level requirements of the dual triode 50 are similar to the requirements of the beam pentodes 48.

The relatively large, heavy and expensive output transformer 52 of the amplifier 42 is replaced with a relatively small, light and inexpensive 8K/4K/2K to 8/4 ohm 70 volt line transformer LT. The output transformer LT is center tapped so that each plate P1, P2 of the dual triode 50 sees a 2K ohm load (8K ohm plate-to-plate or 2K ohm plate-to-center tap) with an 8 ohm resistive load. This is matched to the 10.4K ohm AC load line 54 of FIG. 5 with 8.2K ohm linearizing resistors R3 and R4. With the 10.4K ohm load line, the resistors absorb about 4/5 of the load and improve circuit linearity, which permits the use of a less expensive output transformer LT. The resistors also protect the dual triode 50 in the event of a failure of the output transformer. The combination of the 70 volt line transformer LT configured as aforementioned, the 10.4K ohm AC load line 54 and the 8.2K ohm resistors R3 and R4 produces an output signal that matches the +4dBv input level to the solid state amplifier 22 employed as a power amplifier.

The fixed bias scheme of the amplifier 42 is eliminated and replaced with cathode bias. Accordingly, resistors R5 and R6 are connected to ground and the negative bias supply eliminated. Resistor R9 and capacitor C3 are directly coupled to the cathodes K1, K2 of the dual triode 50. Cathode bias has the advantage of not requiring customization as a function of tube operating point, and therefore readjustment when the tubes are replaced. Cathode bias is also more stable since it employs negative feedback. While some amount of output signal swing and therefore output signal power is lost, an outstanding advantage of the present invention is that this loss becomes insignificant as a result of the scaling.

An 8 ohm resistor is connected at the secondary of the transformer LT to replace the impedance of the loudspeaker 28.

Figure 6:
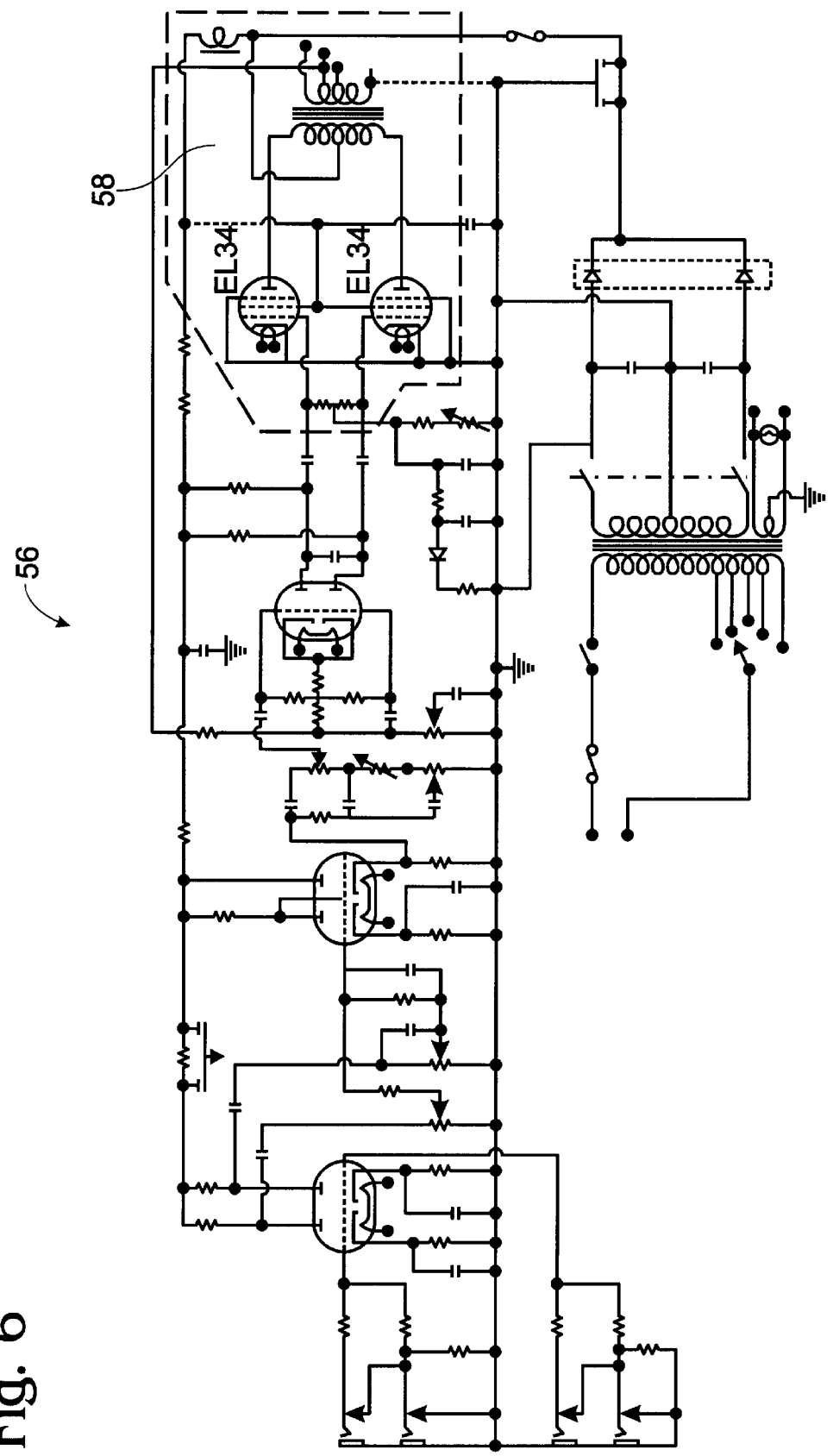
FIG. 6 is a schematic of a prior art Marshall tube amplifier.
Figure 7:
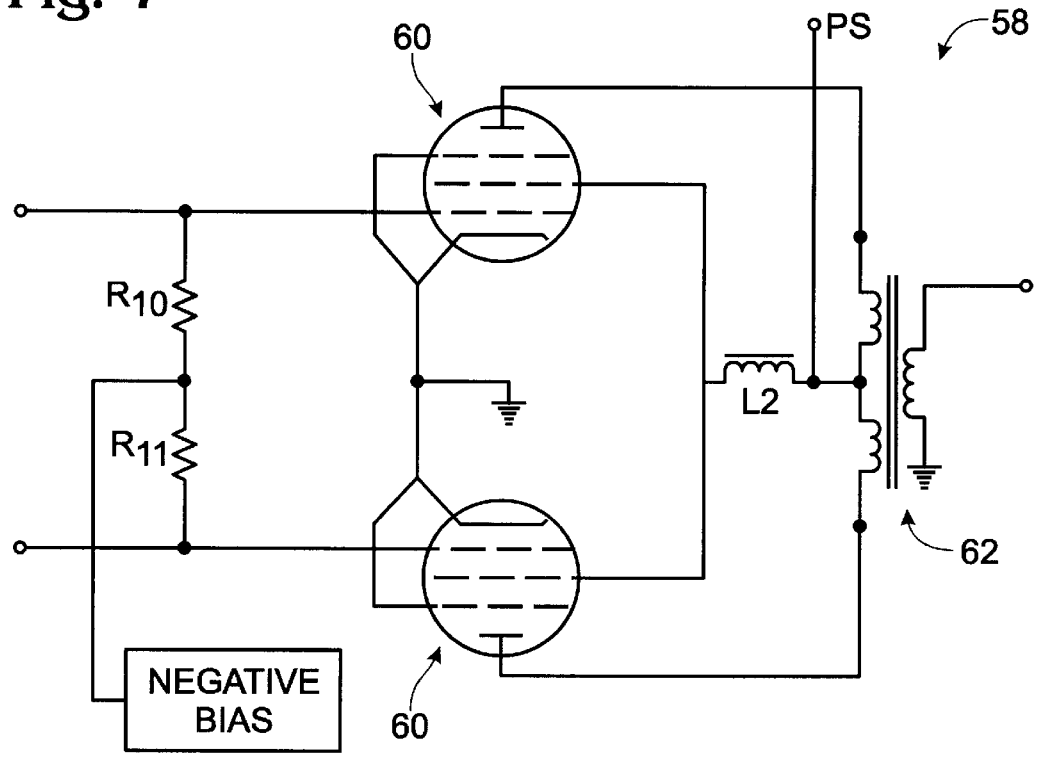
FIG. 7 is a simplified schematic of the power output section of the amplifier of FIG. 6.
Figure 8:
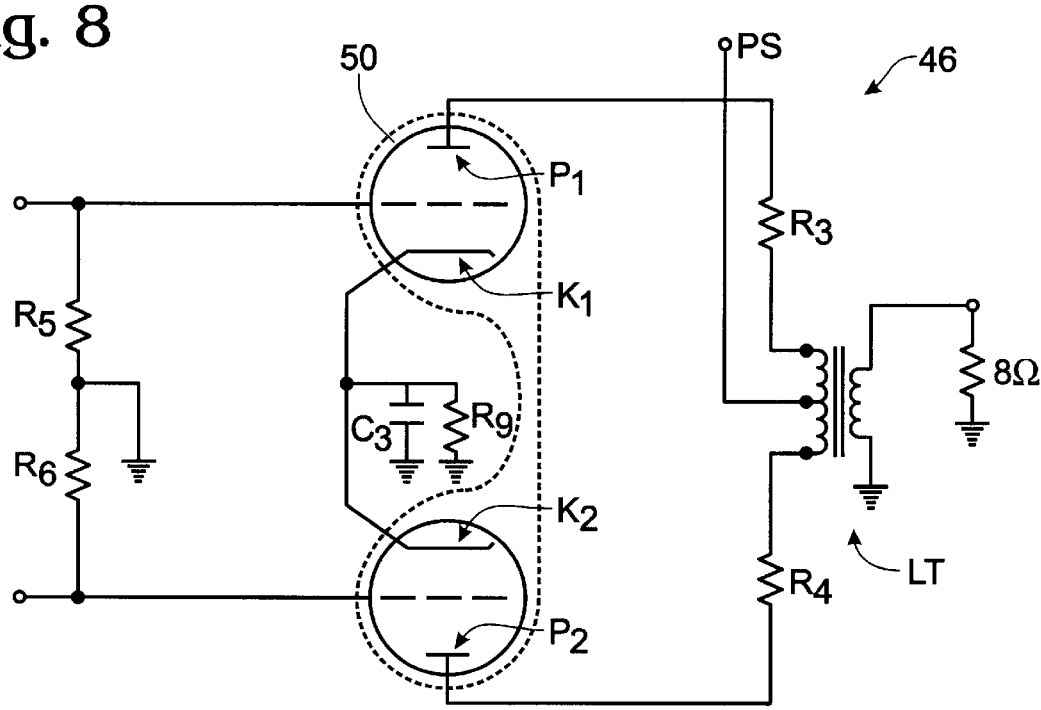
FIG. 8 is a schematic of the power output section of FIG. 6, scaled according to the present invention.

Referring to FIG. 6, a schematic of a representative Marshall amplifier 56, the "Marshall 1987," is depicted. A power output section 58 of the amplifier 56 is shown in FIG. 7, while a scaled power output section 46 according to FIG. 8 is preferred for scaling the amplifier 56.

In the Marshall amplifier 56, EL-34 beam power pentodes 60 are replaced with the single 12AU7 dual triode 50. The choke L2 is therefore eliminated. Again, the drive level requirements of the dual triode 50 are similar to the requirements of the beam pentodes 60.

The output transformer 62 of the amplifier 56 is replaced with the 8K/4K/2K to 8/4 ohm 70 volt line transformer LT. The fixed bias scheme of the amplifier 56 is eliminated and replaced with cathode bias. Accordingly, resistors R10 and R11 are connected to ground and the negative bias supply is eliminated.

Figure 9:
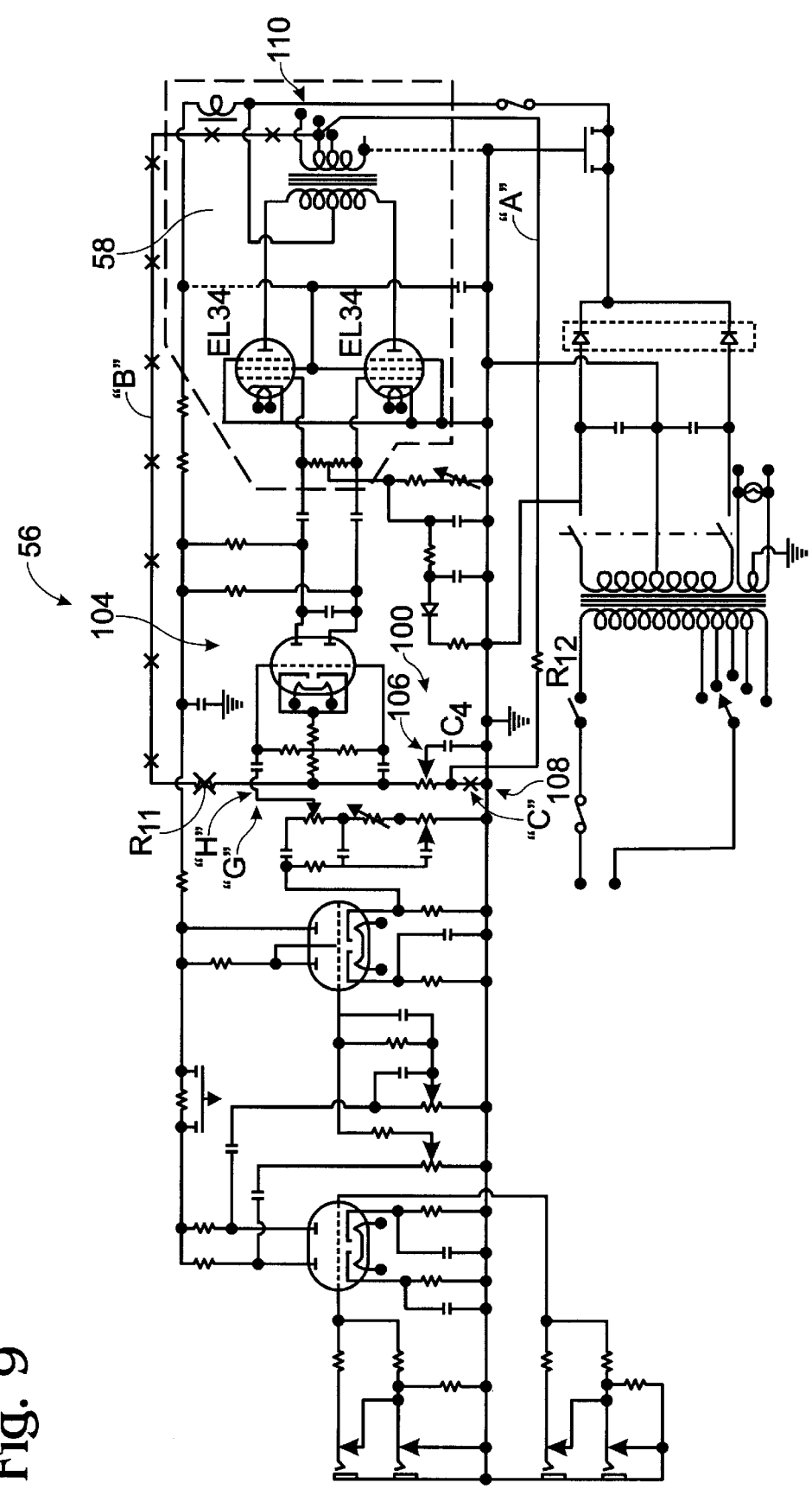
FIG. 9 is the schematic of the amplifier of FIG. 6 showing a modification to the presence circuit thereof in connection with scaling the amplifier according to the present invention.

Referring to FIG. 9, a presence circuit 100 is originally provided in the particular Marshall amplifier 56 herein described. The particular model of the Fender amplifier 42 described herein does not originally include a presence circuit, although some other Fender amplifiers do include this feature. Presence circuits generally introduce negative feedback from the output of the amplifier to the grid of the non-inverting triode of the phase splitter feeding the push-pull power output sections. The amount of feedback is frequency dependent and depends also on the setting of a potentiometer control, such as the potentiometer 106 of the Marshall amplifier 56. However, in the scaled power output section 46, only about 1/5 of the "normal" output voltage is present because of the 8.2K ohm resistors R3 and R4. Therefore, the presence circuit will not operate as designed without modification.

Accordingly, the presence circuit 100 of the Marshall amplifier is preferably modified, and it has also been found preferable to adapt the Fender amplifier to include presence control. To modify the presence circuit 100 of the Marshall amplifier 56, the grounded terminal 108 of the presence control potentiometer 106 is tied directly to the output 110 through new line "A". Original lines "B" and "C" are removed, along with resistor R11. A low valued series resistor R12, such as about 200 ohms, is provided in line "A" to prevent the capacitor C4 from shunting the output of the amplifier to ground under certain conditions of the setting of the potentiometer.

Figure 10:
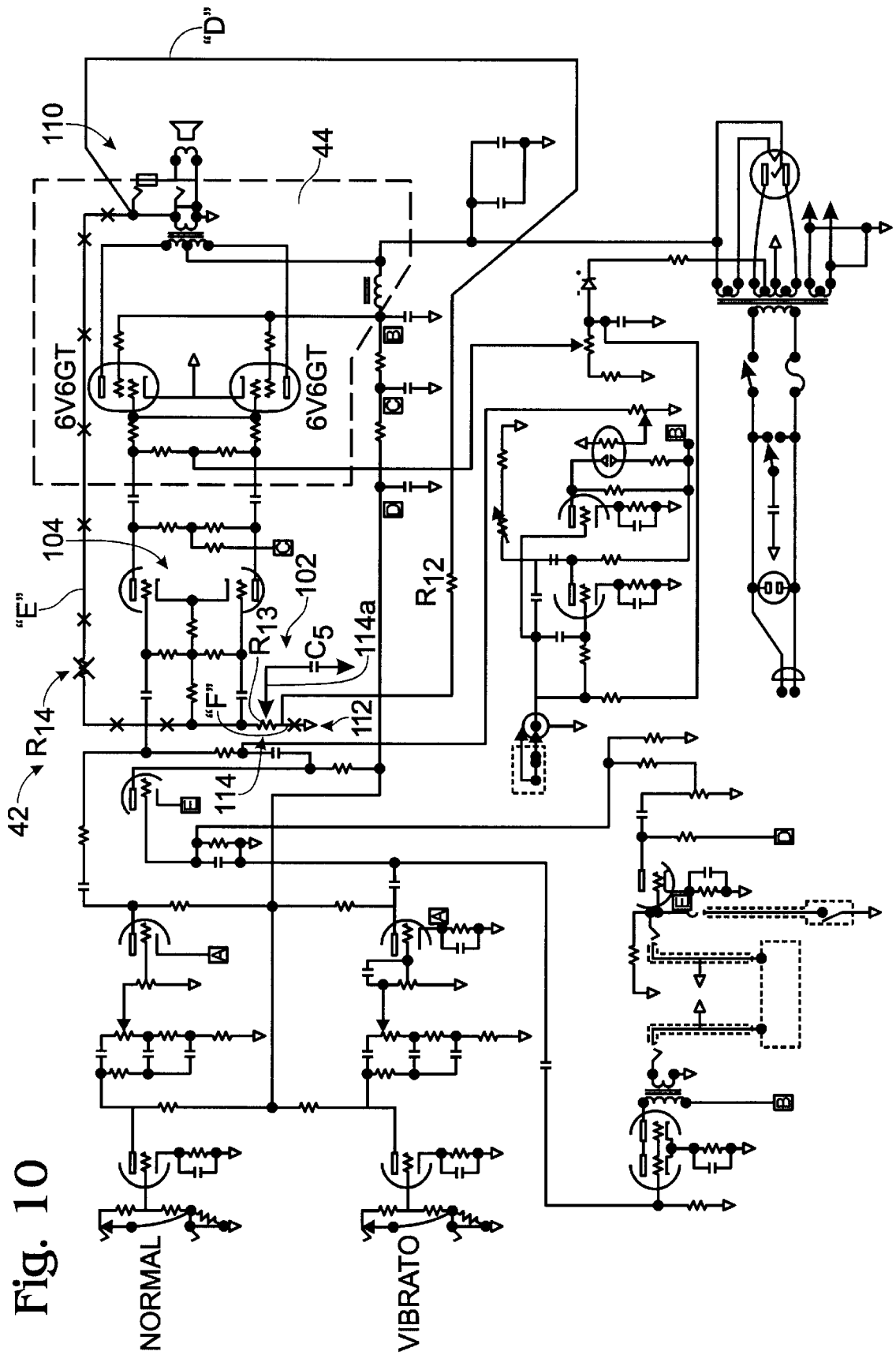
FIG. 10 is the schematic of the amplifier of FIG. 2 showing a modification to the presence circuit thereof in connection with scaling the amplifier according to the present invention.

Turning now to FIG. 10, an example is provided of a presence circuit 102 that is added to the Fender amplifier 42. In the example, the grounded terminal 112 of the presence resistor R13 is tied directly to the output 110 through the new line "D." Original lines "E" and "F" are removed, along with the 820 ohm resistor R14. The resistor R13 is replaced with a 5K ohm potentiometer 114 wherein the wiper 114*a* is capacitively coupled to ground via a 1 microfarad capacitor C5. The low valued series resistor R12 is employed in the line "D" for the purpose just described in connection with the Marshall amplifier 56.

Figure 11:
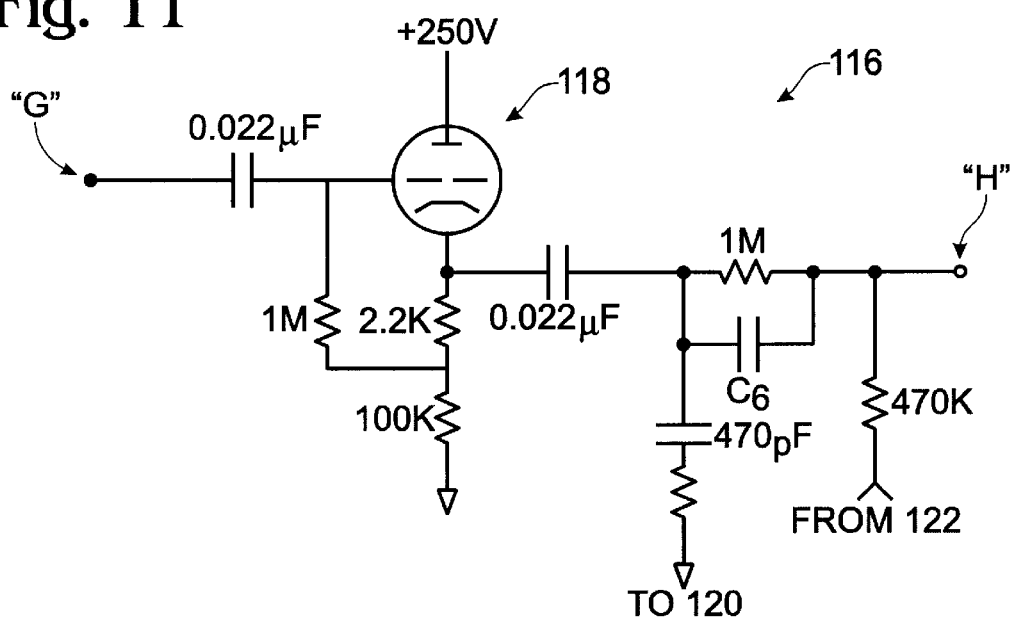
FIG. 11 is a schematic of a reverb circuit for use with the amplifier of FIG. 6 according to the present invention.
Figure 12:
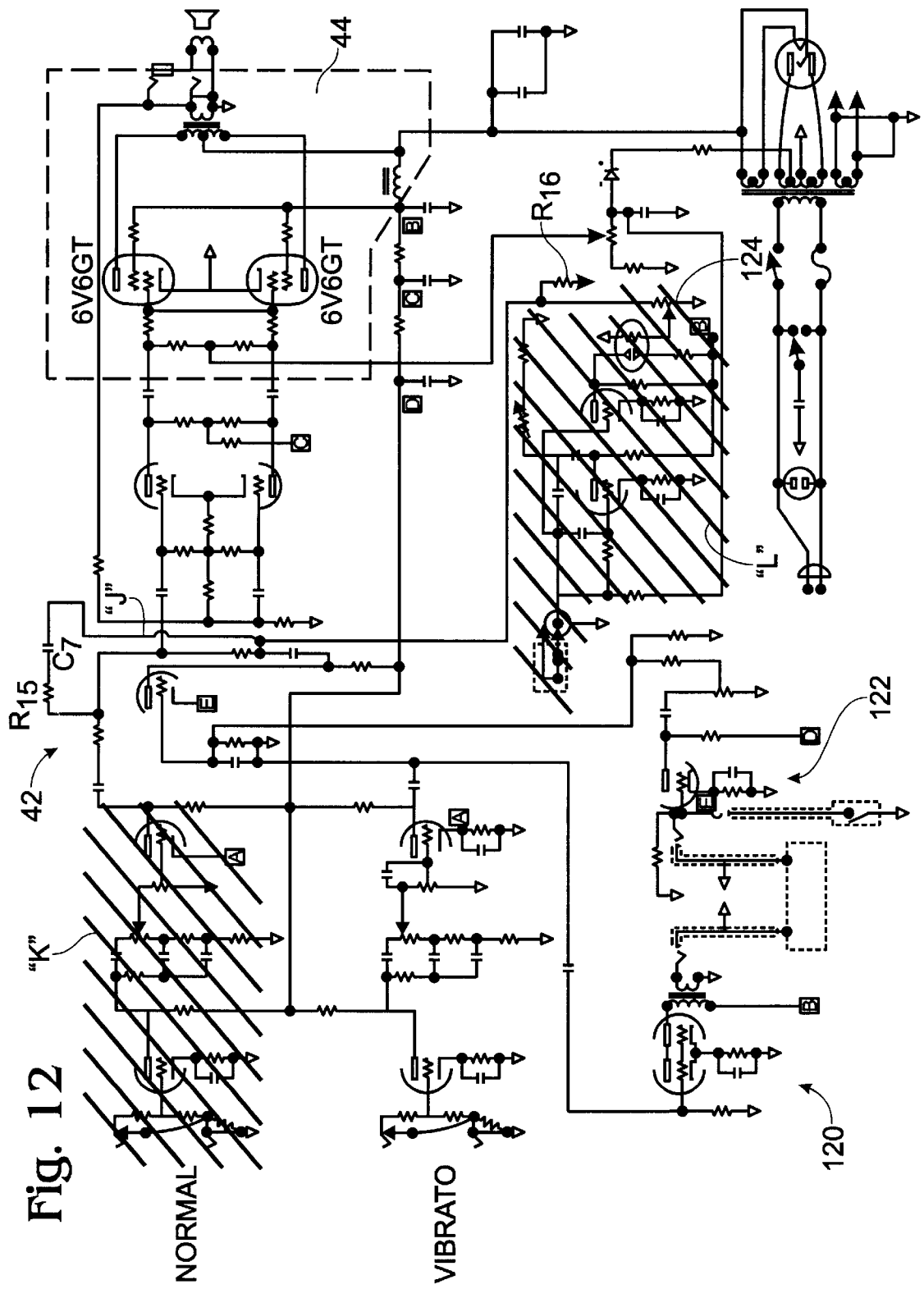
FIG. 12 is the schematic of the amplifier of FIG. 2, showing further modifications thereto in connection with scaling the amplifier according to the present invention.

A reverb circuit 116 is preferably added to the Marshall amplifier 56, since such a circuit is not provided in the particular model discussed herein. The reverb circuit 116 of FIG. 11 is connected between the points labeled "G" and "H" in FIG. 9. A buffer 118, such as a 12AX7, is configured as a unity gain cathode follower for minimizing additional distortion. The value of the reverb coupling capacitor C6 is nominally 10 pf in a typical reverb circuit; however, it has been found that sonic characteristics more closely equaling those of the original amplifier 42 are obtained where C6 is 120 pf This provides greater high frequency emphasis. Referring to FIG. 12, the Fender amplifier 42 includes a reverb driver circuit 120 and a reverb input amplifier circuit 122 which are preferably replaced with solid state equivalents. Similar circuits are also provided for the Marshall reverb circuit 116 as indicated in FIG. 11.

Additional high frequency emphasis has also been found desirable in the scaled version of the Fender amplifier 42. Referring to FIG. 12, a 220K ohm resistor R15 and 360 pf capacitor C7 are provided along new line "J."

In scaling the Fender amplifier 42, it may not be deemed necessary or desirable to include all portions thereof For example, in some applications portions of the amplifier labeled "K" and "L" may be removed as indicated in FIG. 12. However, in removing the portion "L", the original 50K ohm potentiometer 124 should be replaced with about a 50K ohm resistor R16, 43K ohms being sufficiently close, to maintain the originally designed attenuation between stages.

Though very specific embodiments of scaling a tube amplifier according to the present invention have just been described, it will be understood that other amplifiers, configurations and design choices may be employed without departing from the principles of the invention.

Figure 13:
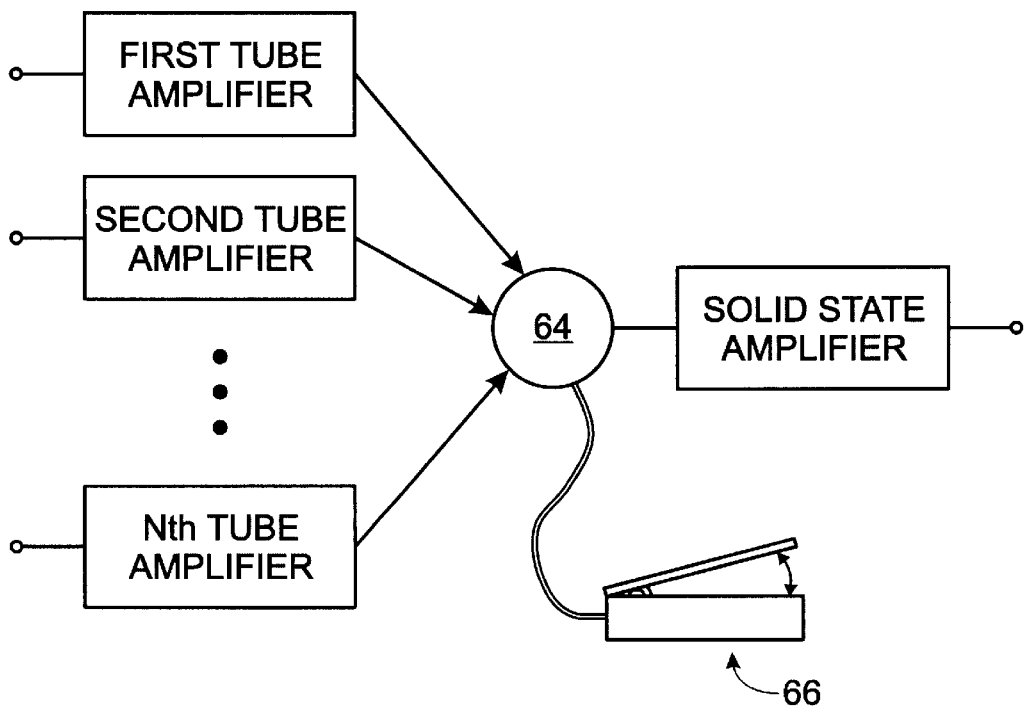
FIG. 13 is a block diagram of a second embodiment of an amplifier according to the present invention.

In one embodiment of the invention, the amplifier section 20 is the sole front end to the solid state amplifier section 22 as just described. Referring to FIG. 13, in another embodiment of the invention, a plurality of tube amplifier sections 47(*i*) are coupled in parallel and input to a mixing circuit 64 for selectably mixing the outputs of the tube amplifiers and providing the mixed outputs to the solid state amplifier. That is, the first amplified signal includes a selectable first proportion of the output of a first tube amplifier section, plus a selectable second proportion of the output of a second tube amplifier section, and so on. An advantage of the present invention is that such mixing mixes signals having relatively low power, so that the mixing circuit need not be adapted to dissipate large amounts of power.

Preferably, the mixing circuit 64 is incorporated in a control mechanism 66 adapted for operation by a user's foot (hereinafter "foot-pedal"). The foot-pedal 66 provides for substantially continuously or "infinitely" varying the degree of mixing provided by the circuit. The foot-pedal typically includes a hinged or pivotally connected pedal, one or more potentiometers, and a cable connecting therebetween so that movement of the pedal about its hinge moves the respective wipers of the potentiometers. It is especially convenient to employ a foot-pedal 66 adapted for operation as a result of side-to-side movement of the pedal. Providing the capability to continuously mix the signals from different amplifiers providing different levels or characteristics of distortion affords the musician a greater degree of control. In addition, providing for mixing at the output of the vacuum tube amplifier sections substantially decreases noise. In conventional mixing, the mixer precedes the amplifiers whose contributions to the overall output it is desired to control. The amplifiers are set at a preset, high level of amplification and the mixer apportions the input between the amplifiers to control the amount of amplification in the amplifiers. However, even though the input to the amplifiers may be reduced, the amplifiers continue to amplify noise on the line that connects its input from the mixer, and continue to generate noise, at levels commensurate with the preset, high level of amplification. Accordingly, the signal may be proportionally reduced but the noise is always maximum. In the configuration of the present invention, however, since the outputs of the amplifier are mixed, signal and noise are proportioned together. In achieving this configuration, advantage is taken of the fact that the tube amplifier sections which precede the mixer are scaled to produce relatively low power, so that standard electronic mixing circuitry may be employed.

The outputs of the Fender and Marshall amplifiers are 180 degrees out of phase, so when mixing the outputs of these amplifiers, the output of one or the other should be inverted, such as by using a unity gain inverting buffer.

Figure 14:
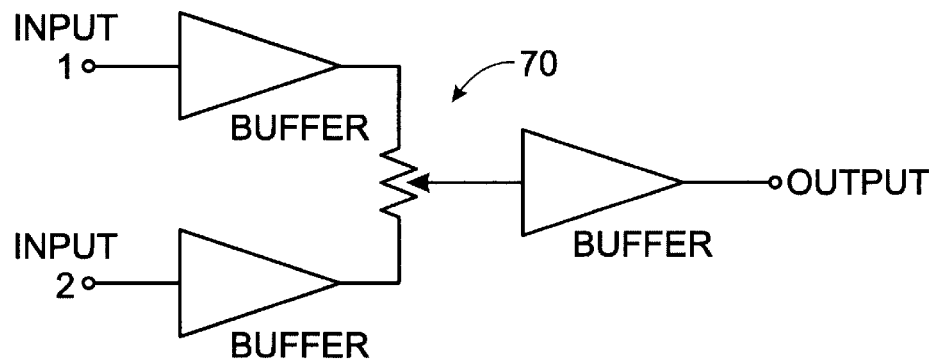
FIG. 14 is a block diagram of a two-input mixing circuit for use with the embodiment of FIG. 9.
Figure 15:
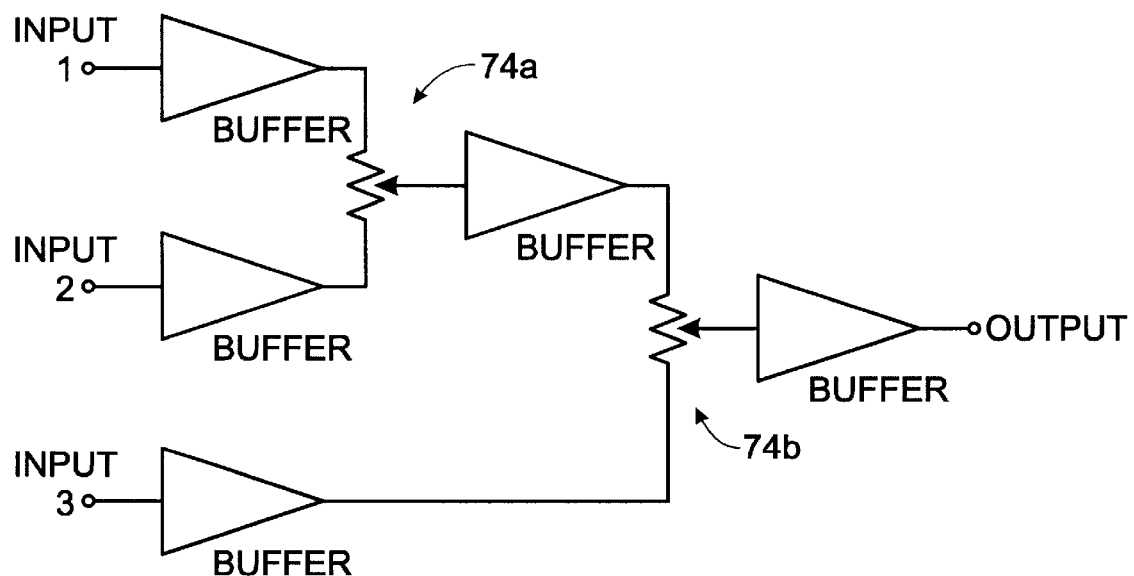
FIG. 15 is a block diagram of a three-input mixing circuit for use with the embodiment of FIG. 9.

Referring to FIG. 14, an example of a two-input mixing circuit 68 is depicted. The mixing circuit 64 employs a single potentiometer 70 that may be installed, for example, in the foot-pedal 66. Referring to FIG. 15, an exemplary three-input mixing circuit 72 employs two potentiometerss 74*a* and 74*b*. A joy-stick may be coupled to the potentiometers 74*a* and 74*b*. Extending these examples to mixing more than three inputs will be readily apparent to those of ordinary skill in light thereof It should be understood that any equivalent mixing circuit having other configurations or components may be employed without departing from the principles of the invention.

Figure 16A:
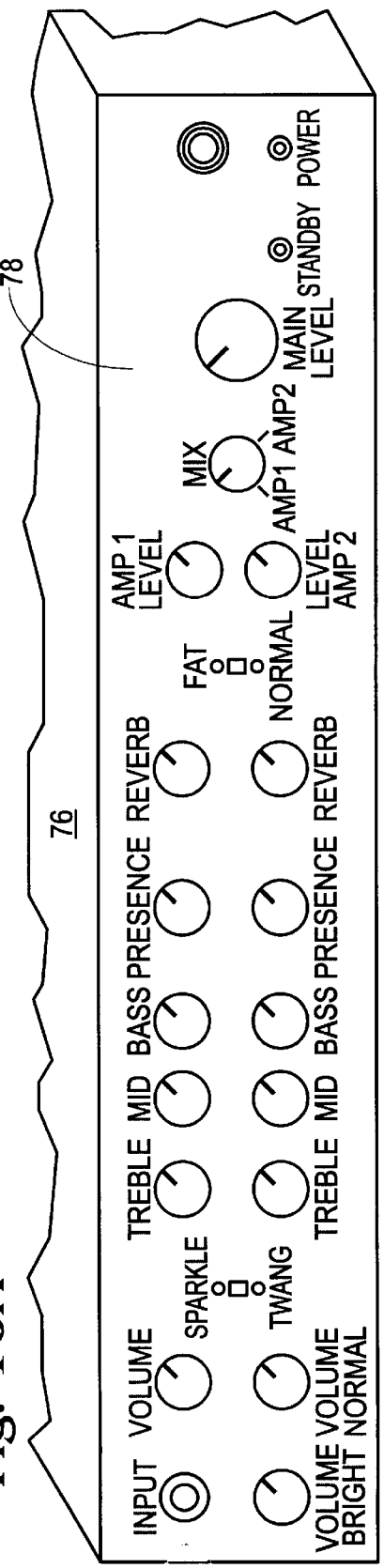
FIG. 16A is an elevation of a front panel of an exemplary amplifier according to the present invention.
Figure 16B:
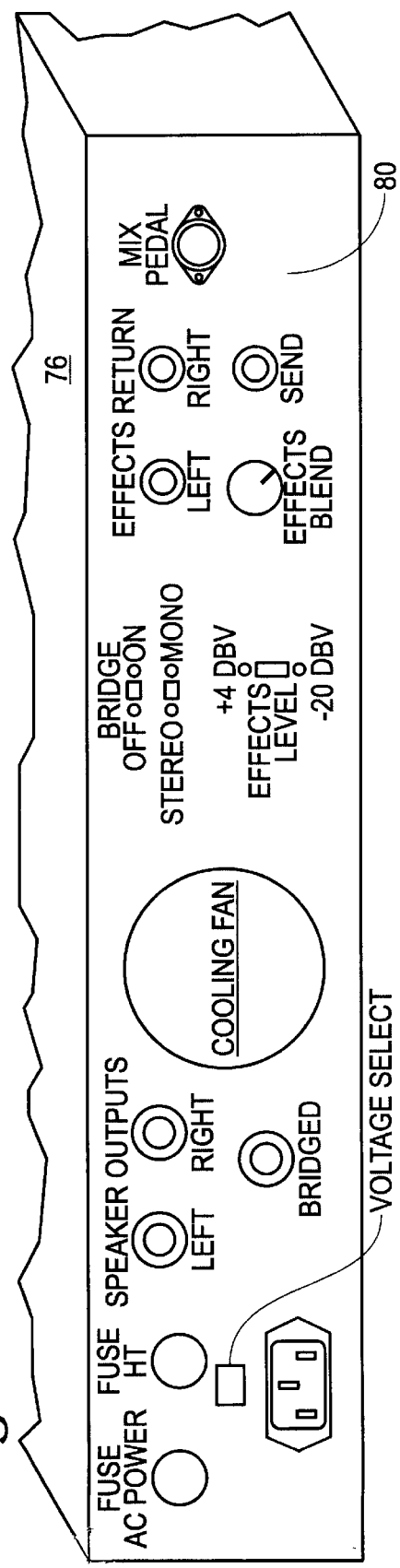
FIG. 16B is an elevation of a rear panel of an exemplary amplifier according to the present invention.

Any number of the tube amplifier sections 20 or 48, and the solid state amplifier section 22, may be incorporated in separate housing or, preferably, may be incorporated in a single housing 76. Particularly, it is preferable to include in the housing the Fender tube amplifier section 42, the Marshall tube amplifier section 46, the solid state amplifier section 22, and the active components of the mixing circuit 64, the potentiometers 70 or 74*a* and 74*b* being preferably disposed in the foot pedal 66 to facilitate operating the mixing circuit. Referring to FIGS. 16A and 16B, respectively, an exemplary front panel 78 and rear panel 80 of the housing 76 adapted for Fender and Marshall tube amplifier sections are depicted.

It is to be recognized that, while a particular hybrid thermionic tube and solid state audio amplifier according to the present invention has been shown as preferred, other configurations could be utilized, in addition to configurations already mentioned, without departing from the principles of the invention. In particular, while the 12AU7 is believed to currently provide the best available match for the beam pentodes 48 and 60, is inexpensive, readily available and possesses much greater reliability, the invention is not limited to tube amplifier sections employing any particular type of thermionic valve. Similarly, while the 70 volt line transformer LT is inexpensive and readily available, any suitable transformer may be employed, or the transformer may be omitted entirely, without departing from the principles of the invention. Further, the use of the 70 volt line transformer LT configured as aforementioned, the 10.4K ohm AC load line and the 8.2K ohm resistors R3 and R4 provide nicely for the required +4 dBv input to the solid state amplifier section 22; however, other configurations, operating points and circuitry could be employed to realize the invention without departing from the principles thereof.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims that follow.

I claim:

1. A hybrid audio amplifier for amplifying an electrical audio input signal, comprising:

a first audio amplifier section having an input for receiving the audio signal and a power amplification stage having an output, said first audio amplifier being adapted to amplify the audio signal to produce a corresponding first amplified audio signal at said output, said power amplification stage employing at least one thermionic valve to produce said first amplified audio signal and an output transformer for providing said output, said thermionic valve and said output transformer providing a desired characteristic distortion; and a second audio amplifier section coupled in cascade relationship to said first audio amplifier section and having an input for receiving said first amplified audio signal, said second audio amplifier section being adapted to amplify said first amplified audio signal to produce a corresponding second amplified audio signal at a power that is at least sufficient to drive a loudspeaker at ordinary room listening levels, said second audio amplifier section employing solid state circuitry for amplifying relatively linearly said first amplified audio signal to produce said second amplified audio signal.

2. The amplifier of claim 1, wherein said first amplifier section is adapted to produce said first amplified audio signal at a power that is limited to being substantially less than sufficient to drive said loudspeaker at said ordinary room listening levels.

3. The amplifier of claim 2, wherein said power amplification stage of said first amplifier section employs a single dual triode as said thermionic valve.

4. The amplifier of claim 3, including linearizing circuitry coupled to said output transformer and adapted to linearize the output of said first amplifier section.

5. The amplifier of claim 4, wherein said single dual triode is cathode biased.

6. The amplifier of claim 1, further comprising a third audio amplifier section having an input for receiving the audio signal and a power amplification stage having an output, said third audio amplifier section being adapted to amplify the audio signal to produce a corresponding third amplified audio signal at said output of said third audio amplifier section, said power amplification stage of said third audio amplifier section employing at least one thermionic valve to amplify the audio signal to produce said third amplified audio signal, the amplifier further comprising a mixing circuit for selectably mixing said first amplified audio signal and said second amplified audio signal and providing the mixed said first and second amplified signals to said input of said second audio amplifier section.

7. The amplifier of claim 6, wherein said first amplifier section, said second amplifier section and said third amplifier section are all incorporated in a single amplifier housing.

8. The amplifier of claim 6, wherein said mixing circuit is adapted to substantially continuously variably mix said first amplified audio signal and said second amplified audio signal.

9. The amplifier of claim 8, further comprising a foot operated control mechanism adapted for mixing said first amplified audio signal and said second amplified audio signal in response to the movement of said foot operated control mechanism by a user's foot.

10. A method for constructing an amplifier having the advantages of solid state circuitry that emulates the sonic characteristics of a tube amplifier using as a model a tube amplifier having an input for receiving the audio signal and a power amplification stage having an output, the power amplification stage being adapted to amplify the audio signal to produce a corresponding first amplified signal at the output at a power that is at least sufficient to drive a loudspeaker at ordinary room listening levels, the power amplification stage employing at least one thermionic valve for amplifying the audio signal to produce the first amplified signal, the method comprising:

providing a tube amplifier section having an output by scaling the power amplification stage of the tube amplifier, wherein said scaling adapts the architecture of the tube amplifier to produce a second amplified signal that has substantially the sonic characteristics of the tube amplifier at a power that is limited to being substantially less than sufficient to drive the loudspeaker at the ordinary room listening levels;

providing a solid state amplifier section having an input for receiving said second amplified signal, said solid state amplifier section being adapted to amplify said second amplified audio signal to produce a corresponding third amplified audio signal at a power that is at least sufficient to drive the loudspeaker at the ordinary room listening levels, said solid state amplifier section employing solid state circuitry for amplifying said second amplified signal to produce said third amplified audio signal; and coupling said output of said tube amplifier section to said input of said solid state amplifier section.

11. The method of claim 10, wherein said scaling includes employing a single dual triode where the tube amplifier employs two beam pentodes.

12. The method of claim 11, wherein said scaling includes employing cathode bias for said single dual triode where the tube amplifier employs fixed biasing of said two beam pentodes.

13. The method of claim 11, wherein said tube amplifier section is provided to include an output transformer for providing said output, and wherein said scaling includes employing linearizing circuitry coupled to said output transformer and adapted to linearize the output of said tube amplifier section.

14. The method of claim 11, wherein said tube amplifier includes a relatively high power output transformer for providing said output, and wherein said scaling includes employing a relatively low power output transformer in the place of said high power output transformer.

15. A method for mixing the characteristics of a plurality of tube amplifiers, comprising:

providing a first audio amplifier having an input for receiving the audio signal and a power amplification stage having an output, said first audio amplifier being adapted to amplify the audio signal to produce a corresponding first amplified audio signal at said output at a power that is limited to being substantially less than a desired power for driving a loudspeaker at ordinary room listening levels, said power amplification stage employing at least one thermionic valve to produce said first amplified audio signal;

providing a second audio amplifier having an input for receiving the audio signal and a power amplification stage having an output, said second audio amplifier being adapted to amplify the audio signal to produce a corresponding second amplified audio signal at said output of said second audio amplifier at a power that is limited to being substantially less than said desired power, said power amplification stage of said second audio amplifier employing at least one thermionic valve to produce said second amplified audio signal;

selectably mixing said first amplified audio signal and said second amplified audio signal to produce a mixed audio signal; and providing a third audio amplifier having an input for receiving said mixed audio signal and a power amplification stage, said power amplification stage of said third audio amplifier employing solid state circuitry for amplifying relatively linearly said mixed audio signal to a power at least about equal to said desired power.

16. The method of claim 15, wherein said selectably mixing substantially continuously mixes said first amplified audio signal and said second amplified audio signal.

17. The method of claim 15, wherein said step of selectably mixing said first amplified audio signal and said second amplified audio signal includes controlling said mixing by a foot operated control mechanism.

18. The method of claim 15, wherein at least one of said first and said second audio amplifiers includes an output transformer providing said output.

19. The method of claim 15, further comprising providing said first audio amplifier, said second audio amplifier and said third audio amplifier in a single amplifier housing.

* * * * *

UNITED STATES PATENT AND TRADEMARK OFFICE
CERTIFICATE OF CORRECTION

PATENT NO.    : 6,140,870
DATED         : October 31, 2000
INVENTOR(S)   : Erick M. Cook It is certified that error appears in the above-identified patent and that said Letters Patent is hereby corrected as shown below:

Column 7,
Line 16, change "a 1 microfarad" to -- a .1 microfarad --;
Line 30, change "120 pf This" to -- 120 pf. This --;
Line 38, change "360 pf" to -- 360 pf. --;
Line 41, change "thereof For" to -- thereof. For --.

Column 8,
Line 43, change "potentiometerss" to -- potentiometers --;

Column 12,
Lines 15 and 22, change "method of claim 15," to -- method of claim 16, --.

Signed and Sealed this

Eighth Day of March, 2005

JON W. DUDAS
*Director of the United States Patent and Trademark Office*